(12) United States Patent
Hasegawa et al.

(10) Patent No.: US 10,815,013 B1
(45) Date of Patent: Oct. 27, 2020

(54) COATINGS FOR MULTILAYER INSULATION MATERIALS

(71) Applicant: United States of America as represented by the Administrator of NASA, Washington, DC (US)

(72) Inventors: Mark M Hasegawa, Highland, MD (US); Kenneth O'Connor, Greenbelt, MD (US); Alfred Wong, Greenbelt, MD (US); George M. Harris, Greenbelt, MD (US); Grant Smith, Greenbelt, MD (US)

(73) Assignee: United States of America as represented by the Administrator of NASA, Washington, DC (US)

( * ) Notice: Subject to any disclaimer, the term of this patent is extended or adjusted under 35 U.S.C. 154(b) by 243 days.

(21) Appl. No.: 16/143,732

(22) Filed: Sep. 27, 2018

(51) Int. Cl.
| | |
|---|---|
| *B32B 15/04* | (2006.01) |
| *B32B 17/06* | (2006.01) |
| *B64G 1/22* | (2006.01) |
| *C23C 14/08* | (2006.01) |
| *C23C 14/20* | (2006.01) |
| *C23C 14/10* | (2006.01) |
| *C23C 14/30* | (2006.01) |

(52) U.S. Cl.
CPC ............ *B64G 1/226* (2013.01); *C23C 14/081* (2013.01); *C23C 14/086* (2013.01); *C23C 14/10* (2013.01); *C23C 14/20* (2013.01); *C23C 14/30* (2013.01)

(58) Field of Classification Search
USPC .................................. 428/426, 428, 432, 688
See application file for complete search history.

(56) References Cited

U.S. PATENT DOCUMENTS

| | | | | |
|---|---|---|---|---|
| 3,687,713 A * | 8/1972 | Adam | ................ | C03C 17/3615 428/623 |
| 3,978,273 A * | 8/1976 | Groth | .................. | C03C 17/3652 428/434 |
| 4,106,859 A * | 8/1978 | Doriguzzi | .............. | G02B 5/126 349/113 |
| 4,348,463 A * | 9/1982 | Ohno | ....................... | G02B 5/08 359/884 |
| 5,019,458 A * | 5/1991 | Elgat | ....................... | C03C 17/36 359/883 |
| 10,429,549 B2 * | 10/2019 | Schurmann | .............. | G02B 1/14 |
| 10,436,955 B2 * | 10/2019 | Dasbach | .............. | G02B 5/0858 |

(Continued)

*Primary Examiner* — Lauren R Colgan
(74) *Attorney, Agent, or Firm* — Matthew F. Johnston; Bryan A. Geurts; Helen M. Galus

(57) ABSTRACT

A laminate has a composite coating on a substrate. The substrate is a polymeric substrate with a surface resistivity of $4\times10^2$ to $1\times10^8 \Omega/\square$; or a textured substrate with surface features which are 100 nm to 10 microns high. The composite coating comprising a tie layer of a nickel-chromium alloy; a layer of a reflective metal; a layer of aluminum oxide; a layer of silicon oxide; and optionally a layer of indium tin oxide. The laminate has a solar absorbance at a wavelength of 0.25 microns to 2.5 microns of between 0.07 and 0.7; and the laminate has an IR emittance of 0.1 to 0.8. Solar absorbance and IR emittance of the laminate may be independently to control the ratio of solar absorbance to IR emittance. Solar absorbance may be adjusted by changing the surface resistance or degree of texturing on the substrate. IR emittance may be adjusted by changing oxide film thickness.

20 Claims, 11 Drawing Sheets

(56) References Cited

U.S. PATENT DOCUMENTS

| | | | | |
|---|---|---|---|---|
| 2008/0116191 | A1* | 5/2008 | Allen | H05B 3/845 |
| | | | | 219/219 |
| 2010/0238571 | A1* | 9/2010 | Frissen | F21V 7/24 |
| | | | | 359/843 |
| 2011/0308693 | A1* | 12/2011 | Van Nutt | B32B 15/08 |
| | | | | 156/60 |
| 2012/0287521 | A1* | 11/2012 | Kumagai | G02B 5/0808 |
| | | | | 359/884 |
| 2013/0105069 | A1* | 5/2013 | Van Nutt | F16L 59/02 |
| | | | | 156/187 |
| 2013/0222933 | A1* | 8/2013 | Eguro | F24S 23/70 |
| | | | | 359/838 |
| 2013/0342900 | A1* | 12/2013 | Koeckert | F24S 23/82 |
| | | | | 359/360 |
| 2014/0342174 | A1* | 11/2014 | Tominaga | G02B 5/0808 |
| | | | | 428/551 |
| 2015/0298602 | A1* | 10/2015 | Yoshida | G02B 5/09 |
| | | | | 362/549 |

* cited by examiner

COATINGS FOR MULTILAYER INSULATION MATERIALS

ORIGIN OF THE INVENTION

The invention described herein was made by an employee of the United States Government, and may be manufactured and used by or for the Government for Government purposes without the payment of any royalties thereon or therefore.

TECHNICAL FIELD

This disclosure relates generally to multilayer insulation materials for use in space environments, which offer low solar absorbance, low IR reflectance, and high IR emittance. The materials can be made to reduce specularity and provide charge bleed off characteristics.

BACKGROUND

In charging environments such as geosynchronous orbit, commonly used include coated or uncoated black polyimide films, such as black Kapton®, Germanium coated black Kapton® or StaMet™ coated black Kapton®, aluminized films, or Indium tin oxide (ITO) coated silver FEP Teflon, where FEP Teflon is poly(tetrafluoroethylene-co-hexafluoropropylene). The polyimide substrate and aluminized films allow rapid dissipation of electrostatic charges, but do not offer a low ratio of solar absorptance ($\alpha$) to IR emittance ($\varepsilon_N$). With a high $\alpha/\varepsilon_N$ ratio, the films are prone to overheating in sunlight. ITO-coated silver FEP Teflon does provide a low a/EN ratio, but the ITO coating on the silver Teflon is fragile easily damaged or removed. The FEP Teflon film is susceptible to optical and structural damage in particle radiation, and is stiff and non-compliant when incorporated into a multilayer insulation (MLI) blanket.

Over the last forty years, the Goddard Composite Coating (GCC) has been applied to Kapton® HN films to provide a stable, low solar absorptance, high IR emittance thermal control surface. GCC films typically include an aluminum oxide tie layer (1,000 A-2,000 A); a metal reflective layer (1200 A); aluminum oxide (10,000-20,000 A) and silicon oxide (4,000-8,000 A) layers, and an optional ITO layer (100 A). However, Kapton® HN is a dielectric film with a smooth surface which does not allow convenient adjustment of solar absorbance. Within limits, the $\alpha/\varepsilon_N$ ratio on such films can be altered by adjusting the thickness of the oxide layers to increase IR emittance; however, changes to the oxide layer thickness may undesirably increase IR reflectance at wavelengths above 10 microns. Further, while increasing IR emittance lowers the $\alpha/\varepsilon_N$ ratio, IR emittance cannot be increased by adjusting oxide layer thickness above about 0.6. This limits the extent to which the $\alpha/\varepsilon_N$ ratio can be adjusted.

Also, conventional GCC thin film coatings have a high film stress that causes the underlying polyimide film to roll tightly. The film stress can also cause cracking or crazing during deposition of the oxide films.

There is a need in the art for films with an $\alpha/\varepsilon_N$ ratio which can be tailored for desired applications, by independently adjusting solar absorbance and IR emittance. There is a further need in the art for films with an adjustable $\alpha/\varepsilon_N$ ratio which are not prone to cracking or crazing during deposition or use.

SUMMARY OF EMBODIMENTS

A brief summary of various embodiments is presented below.

Various embodiments disclosed herein relate to an improved laminate with a Goddard Composite Coating for use in space environments, comprising, in sequence, a polymeric substrate with a conductive filler and a surface resistivity of $4\times10^2$ to $1\times10^8 \Omega/\square$; a layer of nickel or a nickel alloy; a layer of a reflective metal; a layer of aluminum oxide; and a layer of silicon oxide. In some embodiments, the layer of silicon oxide is the outermost layer. In some embodiments, the layer of silicon oxide is coated with a thin layer of indium tin oxide. Conductive carbon in the substrate may be used to roughen the surface and increase solar absorbance and provide diffuse reflectance.

Some embodiments disclosed herein relate a Goddard Composite Coating for use in space environments, deposited on a textured substrate with surface features which are 100 nm to 10 microns high; a layer of nickel or a nickel alloy; a layer of a reflective metal; a layer of aluminum oxide; and a layer of silicon oxide.

In embodiments with a substrate with a conductive filler, the laminate has a solar absorbance at a wavelength of 0.25 microns to 2.5 microns of between 0.07 and 0.7; and an IR emittance of 0.1 to 0.8. The laminate may have a surface resistivity of $4\times10^2$ to $8\times10^3 \Omega/\square$, and a solar absorbance of 0.16 to 0.37; a surface resistivity of $2\times10^5$ to $1\times10^7 \Omega/\square$, and a solar absorbance of 0.13 to 0.18; or a surface resistivity of greater than $1\times10^7 \Omega/\square$, and a solar absorbance of 0.07 to 0.09.

The improved Goddard Composite Coating may also be deposited on a substrate, where the substrate is a metal sheet, a metal foil, or a conductive or non-conductive polymeric film. In some embodiments, the substrate is a polymeric film having a melting point or decomposition point of at least 200° C. The polymeric film may be a biaxially oriented polyester film, e.g., Mylar, or a polyimide film.

The improved Goddard Composite Coating may be deposited on a substrate with a smooth surface. The combination of the improved Goddard Composite Coating and a smooth substrate provides low solar absorbance and specular reflectance of light having a wavelength of 2.5 nm to 2.5 microns.

Alternatively, the improved Goddard Composite Coating is deposited on a substrate with a roughened surface having features with a peak-to-valley height of 100 nm to 10 microns, from 200 nm to 5 microns, from 400 nm to 3 microns, or from 500 nm to 2 microns. Methods of roughening the surface include adding a solid filler, e.g., carbon, silica, etc., to a polymeric film; blending a partially or completely incompatible additive into the polymer prior to film formation, e.g., blending polyethylene terephthalate with small amounts of polystyrene and/or a phenoxy resin; and etching the surface of a metal or polymeric foil. The combination of the improved Goddard Composite Coating and a roughened substrate provides diffuse or scattered reflectance of light having a wavelength of 2.5 nm to 2.5 microns, and reduced solar absorbance.

The nickel alloy is a nickel-chromium-iron alloy (Inconel; NiCrFe), a nickel-chromium alloy (NiChrome; NiCr), or substantially pure nickel.

In various embodiments, the nickel alloy layer is Inconel, including: 70% to 99% nickel, 0.5% to 20% chromium, and 0.5% to 10% iron; 72% to 95% nickel, 3% to 19% chromium, and 2% to 9% iron; 75% to 90% nickel, 5% to 18% chromium, and 5% to 7% iron; or 78% to 85% nickel, 10% to 17% chromium, and 5% to 12% iron. While the Inconel alloy may be substantially free of elements other than Ni, Cr, and Fe, the Inconel alloy may optionally comprise minor amounts of Nb, Ta, Co, Mn, Cu, Al, Ti, Si, C, and/or S.

In various embodiments, the Inconel layer is: Inconel 600, comprising about 72% nickel, about 14% to 17% chromium, and about 6% to 10% iron; Inconel X-750, comprising about 72% nickel, about 14% to 17% chromium, and about 5% to 9% iron; or an Inconel alloy comprising about 80% nickel, about 15% chromium; and about 5% iron.

In various embodiments, the nickel alloy is NiChrome, comprising about 70% to about 99.5% nickel and about 0.5% to about 30% chromium; about 72% to about 95% nickel and about 5% to 28% chromium; about 75% to about 90% nickel and about 10% to 25% chromium; about 78% to about 85% nickel and about 15% to 22% chromium; or about 80% nickel and about 20% chromium.

In various embodiments, the layer of nickel or a nickel alloy is substantially pure nickel. Substantially pure nickel may be >95% Ni, >96% Ni, >97% Ni, >98% Ni, greater than 99% Ni, >99.5% Ni, or >99.9% Ni.

The layer of nickel or a nickel alloy is from 50 angstroms to 1000 angstroms thick, from 75 angstroms to 1500 angstroms thick, from 100 angstroms to 1000 angstroms thick, from 100 angstroms to 500 angstroms thick, from 300 angstroms to 750 angstroms thick, or about 500 angstroms thick.

In various embodiments, the layer of reflective metal may be gold, silver, or aluminum. The layer of reflective metal may be from 200 angstroms to 2000 angstroms thick, from 400 angstroms to 1800 angstroms thick, from 600 angstroms to 1600 angstroms thick, from 800 angstroms to 1500 angstroms thick, or about 1200 angstroms thick.

In various embodiments, the layer of aluminum oxide and the layer of silicon oxide are collectively from 10,000 to 50,000 angstroms thick; from 12,000 to 35,000 angstroms thick; or from 14,000 to 28,000 angstroms thick. The ratio of the thickness of the silicon oxide layer to the thickness of the aluminum oxide layer may be from 0.1:1 to 0.25:1, from 0.15:1 to 0.22:1, or about 0.18:1.

Alternatively, the layer of aluminum oxide may be from 0.1 to 10 microns thick, from 0.5 to 5 microns thick, from 0.8 to 3 microns thick, or 1 to 2 microns thick. The layer of silicon oxide may be from 0.1 to 1 micron thick, from 0.25 to 0.9 microns thick, or 0.4 to 0.8 microns thick.

If an indium tin oxide (ITO) layer is present, the ITO layer may be from 30 angstroms to 250 angstroms thick, from 50 angstroms to 200 angstroms thick, from 60 angstroms to 150 angstroms thick, from 60 angstroms to 120 angstroms thick, from 80 angstroms to 110 angstroms thick, or about 100 angstroms thick.

In various embodiments, the improved Goddard Composite Coating has an emittance of 0.1 to 0.8, or 0.4 to 0.8. Further, the improved Goddard Composite Coating has a reflectance of less than 40% for light having a wavelength of 7 to 30 microns, a reflectance of less than 30% for light having a wavelength of 8 to 28 microns; and/or a reflectance of less than 20% for light having a wavelength of 11 to 26 microns. Also, the improved Goddard Composite Coating has a reflectance of greater than 60%, greater than 70%, or greater than 80% for light having a wavelength of 2.5 nm to 2.5 microns.

In some embodiments, roughening the substrate surface by texturing, etching, or adding a conductive filler increases solar absorbance without substantially changing IR emittance, while use of a smoother substrate, e.g., non-conductive polyimide, decreases solar absorbance. In other embodiments, changing the oxide thickness, e.g., alumina thickness, in the GCC coating changes IR emittance without a large impact on solar absorbance. Thus, the ratio of solar absorbance to IR emittance (a/EN) may be selectively increased or decreased by changing either or both the solar absorbance and IR emittance.

In various embodiments, the improved Goddard Composite Coating is prepared by sequential vacuum deposition of a layer of a nickel-chromium alloy; a layer of a reflective metal; a layer of aluminum oxide; a layer of silicon oxide; and optionally an ITO layer on a substrate. The substrate may have a textured surface with features having a peak height of 100 nm to 10 microns. Vacuum deposition is carried out slowly, to prevent cracking or crazing of the Goddard Composite Coating. Vacuum deposition may be electron beam physical vapor deposition, resistive thermal physical vapor deposition, or chemical vapor deposition. Vacuum deposition is carried out at 0.1 to 10 Å/sec, 0.5 to 5 Å/sec, 1 to 4.5 Å/sec, or 2 to 4 Å/sec. Vacuum deposition may be carried out on a flat film surface; on the surface of a film wrapped around the outer surface of a rotating drum; on the surface of a film wrapped around the inner surface of a hollow rotating drum; or on the surface of a film secured to a flat surface or a moving belt. In vapor deposition, the portion of the substrate closest to the deposition target may have an excessively thick coating, while the substrate edges may have a thin coating. To avoid this, a mask or deposition baffle may be placed between the deposition target and the substrate. Regions of the substrate close to the target are partially blocked, so that deposition proceeds evenly across the surface. Slow deposition as described herein leads to reduced film stress in the oxide layers, and prevents or reduces the occurrence of cracking or crazing in the GCC multilayer film. Slow deposition also reduces the incidence of delamination.

In various embodiments, the improved Goddard Composite Coating is used on a substrate for a multilayer insulation blanket in spacecraft. The improved Goddard Composite Coating, in conjunction with an appropriate substrate, may be used to set IR emittance and solar absorbance to desired values, to achieve a desired ratio of solar absorbance to IR emittance. If an ITO film is used on the Goddard Composite Coating, the ITO film allows dissipation of static charge. This prevents arcing, which potentially could damage sensitive equipment or cause radio interference.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

These and other more detailed and specific features of the present invention are more fully disclosed in the following specification, reference being had to the accompanying drawings, in which.

Figure 1:
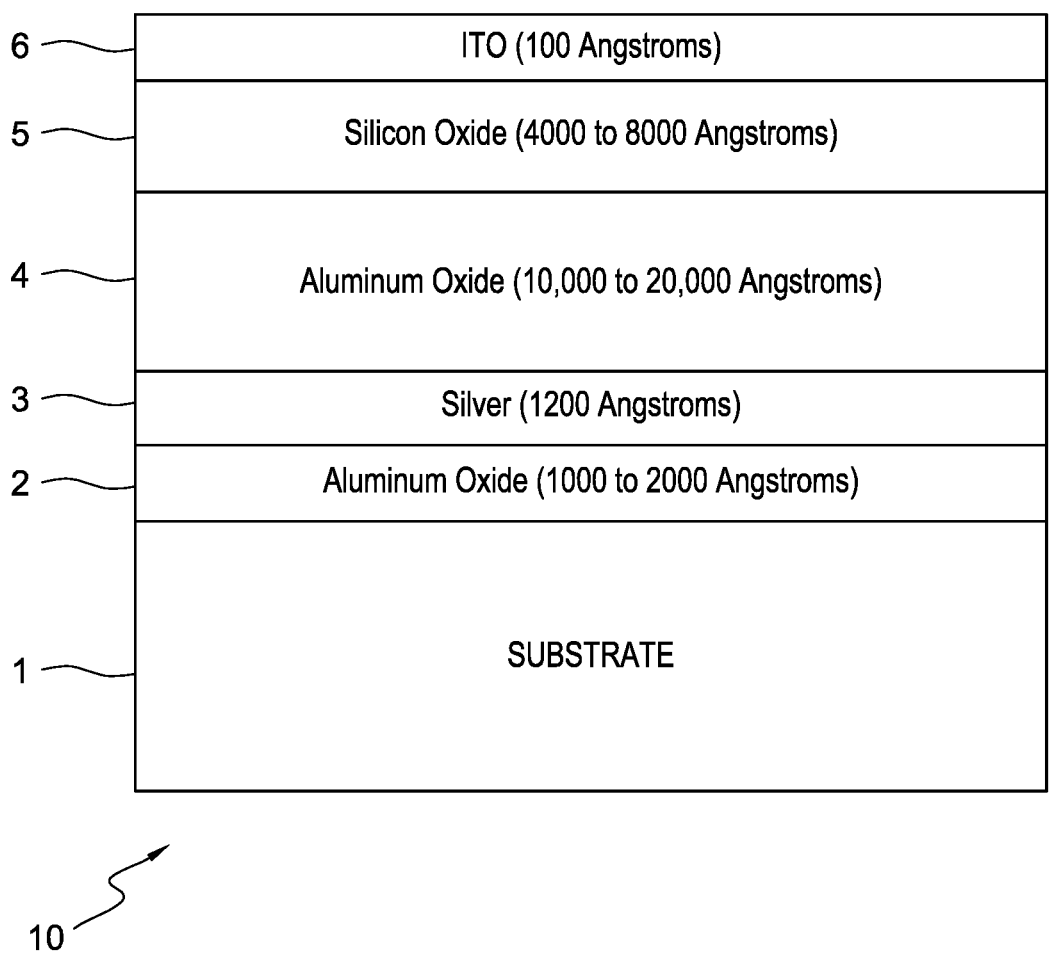
FIG. 1 shows a Goddard Composite Coating with an alumina layer applied to a substrate.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present disclosure so as not to obscure the disclosure with details that will be readily apparent to those of ordinary skill in the art having the benefit of the description herein.

DETAILED DESCRIPTION OF THE INVENTION

It should be understood that the figures are merely schematic and are not drawn to scale. It should also be understood that the same reference numerals are used throughout the figures to indicate the same or similar parts.

The descriptions and drawings illustrate the principles of various example embodiments. It will thus be appreciated that those skilled in the art will be able to devise various arrangements that, although not explicitly described or shown herein, embody the principles of the invention and are included within its scope. Furthermore, all examples recited herein are principally intended expressly to be for pedagogical purposes to aid the reader in understanding the principles of the invention and the concepts contributed by the inventor(s) to furthering the art, and are to be construed as being without limitation to such specifically recited examples and conditions.

The term, "or," as used herein, refers to a non-exclusive or (i.e., and/or), unless otherwise indicated (e.g., "or else" or "or in the alternative"). Also, the various embodiments described herein are not necessarily mutually exclusive, as some embodiments can be combined with one or more other embodiments to form new embodiments. Descriptors such as "first," "second," "third," etc., are not meant to limit the order of elements discussed, are used to distinguish one element from the next, and are generally interchangeable.

"Metallized," as used herein, means deposition of a metal film by vapor deposition. "Aluminized," as used herein, means deposition of an aluminum film by vapor deposition.

"Solar absorbance," as used herein, means absorbance of light having a wavelength of 250 nm to 2.5 microns.

Moreover, in this document, relational terms such as first and second, top and bottom, and the like may be used solely to distinguish one entity or action from another entity or action without necessarily requiring or implying any actual such relationship or order between such entities or actions. The terms "comprises," "comprising," "has," "having," "includes," "including," "contains," "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a," "has . . . a," "includes . . . a," or "contains . . . a" does not, without more constraints, preclude the existence of additional identical elements in the process, method, article, or apparatus that comprises, has, includes, contains the element. The terms "a" and "an" are defined as one or more unless explicitly stated otherwise herein.

The terms "substantially," "essentially," "approximately," "about" or any other version thereof, are defined as being close to as understood by one of ordinary skill in the art, and in one non-limiting embodiment the term is defined to be within 15%, within 10%, in another embodiment within 5%, in another embodiment within 1% and in another embodiment within 0.5%. Unless otherwise indicated, all numbers not limited by a term such as "approximately" or "about" are defined by the significant figures presented herein, e.g., "10" is 9.5 to 10.49; "100" is 99.5 to 100.49; etc. The term "coupled" as used herein is defined as connected, although not necessarily directly and not necessarily mechanically. A device or structure that is "configured" in a certain way is configured in at least that way, but may also be configured in ways that are not listed.

Goddard Composite Coatings (GCC) combine a reflective metal layer with a comparatively thick layer of aluminum and silicon oxides. When placed on a polymeric surface with a conductive filler, GCC coatings have been found on a variety of carbon loaded black polyimide films to provide a tailorable a/EN ratio. The solar absorptance can be varied, depending on whether silver or aluminum is used as a reflective layer, and on characteristics of the substrate. IR emittance can be varied by modifying the thickness of the oxide layers. The GCC coating can bleed charge to the substrate layer, or can be used in conjunction with an ITO layer to dissipate electrostatic charge when needed. The coating can also be tailored to be specular or diffuse depending on the system level optical requirements.

FIG. 1 shows a laminate 10 with a multilayer Goddard Composite Coating (GCC) deposited on substrate 1. The substrate may be a rigid metal sheet, a flexible metal foil, or a polymeric film or sheet. If a polymeric film or sheet is used, the film or sheet preferably is made from a polymer with a melting point or decomposition point above 200° C., including but not limited to polyethylene terephthalate (PET) or polyimides, which may optionally be loaded with conductive carbon. Useful polyimide film substrates are available from DuPont™ under the trade name Kapton®, and are produced from the condensation of pyromellitic dianhydride and 4,4'-oxydiphenylamine. Carbon loaded polyimides are conductive, and provide a roughened matte surface. In the absence of conductive carbon, polyimides are insulators, and provide a smooth, reflective surface.

The multilayer coating in FIG. 1 includes:
  a 1000 to 2000 Angstrom film of aluminum oxide 2;
  a 1200 Angstrom layer of silver 3;
  a 10,000 to 20,000 Angstrom film of aluminum oxide 4;
  a 3,500 to 8,000 Angstrom layer of silicon oxide 5; and
  an optional 100 Angstrom layer of indium tin oxide (ITO) 6.

Aluminum oxide film 2 serves as a tie layer between the substrate and silver layer 3. Silver layer 3 is an opaque reflective layer. The outer ITO layer is a conductive ceramic which dissipates surface charge on the multilayer coating. The ITO layer is optional, and may not be used on the laminate 10 if electrical discharge in the environment of use is not a concern.

A polyimide/$SiO_2$ substrate may be coated with a reflective 1200 angstrom aluminum by vapor deposition. The reflectance of the polyimide/$SiO_2$/Al laminate, film A, was then measured over a wavelength range covering 5 microns to 40 microns.

Next, a 3800 angstrom silica layer was deposited by physical vapor deposition over the aluminum layer of the polyimide/$SiO_2$/Al laminate, film B. Finally, an 18,300 angstrom alumina layer was deposited by physical vapor deposition over the silica layer to produce a polyimide/SiO2/Al/$SiO_2$/$Al_2O_3$ laminate, film C. The reflectance of films B and C was measured between 5 and 40 microns.

For comparison, an 18,300 angstrom alumina layer was deposited by physical vapor deposition over the aluminum layer of the polyimide/SiO2/Al laminate (film A), with no intervening silica layer. The reflectance of the resulting polyimide/SiO2/Al/$Al_2O_3$ laminate, film D, was also measured between 5 and 40 microns.

Figure 2:
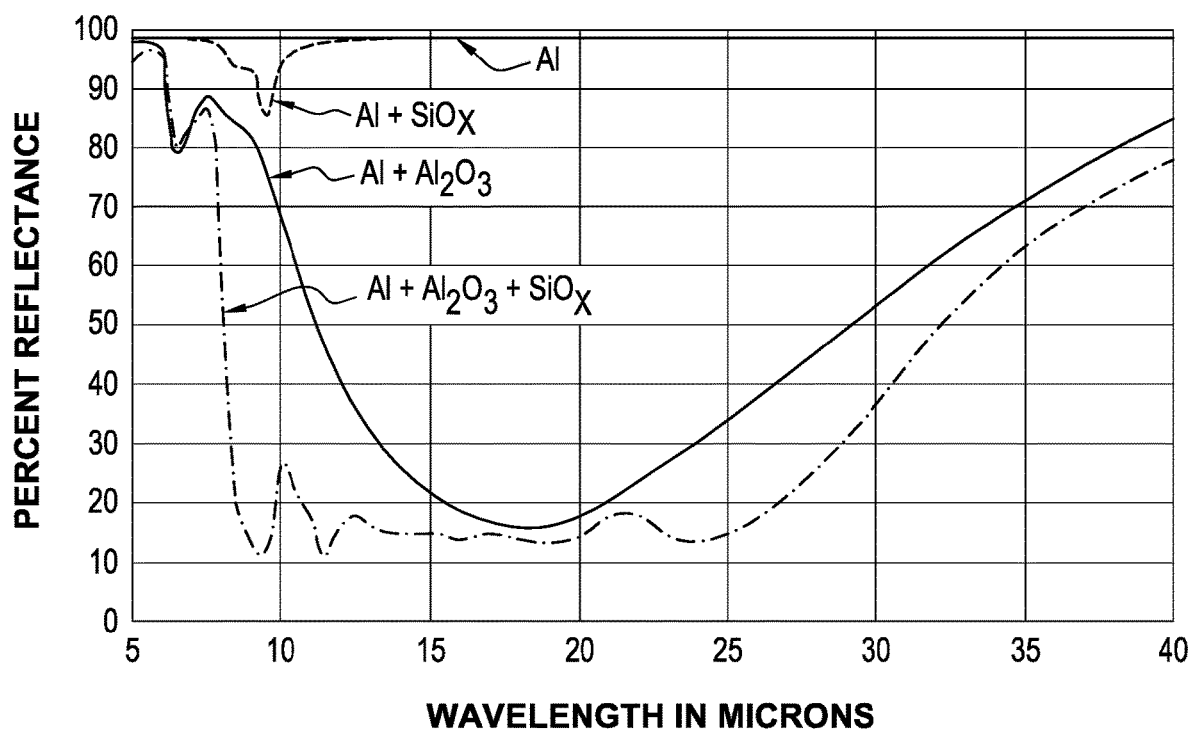
FIG. 2 shows a reflectance as a function of wavelength for a polyimide substrate coated with an aluminum thin film and alumina and/or silica.

The results of the above tests are shown in FIG. 2, and presented in Table 1 below. The reflectance of film A is indicated by the arrow marked Al. The reflectance of films B, C, and D is indicated in FIG. 2 by the arrows marked Al+$SiO_x$, Al+$Al_2O_3$+$SiO_x$, and Al+$Al_2O_3$, respectively.

As seen in FIG. 2, deposition of a silica film on the aluminized film A causes a slight reduction in reflectance between 7.5 and 12.5 microns. The minimum reflectance is about 87%, at a wavelength of about 9.5 microns. Otherwise, the difference in reflectivity between an aluminum film and an aluminum/silica composite film on a polyimide substrate is insignificant.

Deposition of an alumina film on the aluminized film A to produce film D causes a large reduction in reflectance above 10 microns, as seen in FIG. 2. Reflectance of an Al/$Al_2O_3$ composite film is 70% or less between 10 microns and 34 microns, 50% or less between 12 microns and 28 microns, and 30% or less between 13.5 microns and 24 microns.

TABLE 1

| | Reflectance (%) | | | |
| --- | --- | --- | --- | --- |
| Wavelength (microns) | Film A | Film B (difference*) | Film C (difference) | Film D (difference) |
| 5 | 98% | 98% (0%) | 95% (3%) | 98% (0%) |
| 10 | 98% | 95% (3%) | 27% (71%) | 70% (28%) |
| 15 | 98% | 98% (0%) | 15% (83%) | 22% (76%) |
| 20 | 98% | 98% (0%) | 15% (83%) | 18% (80%) |
| 25 | 98% | 98% (0%) | 15% (83%) | 34% (64%) |
| 30 | 98% | 98% (0%) | 37% (61%) | 54% (44%) |
| 35 | 98% | 98% (0%) | 64% (34%) | 73% (25%) |
| 40 | 98% | 98% (0%) | 78% (20%) | 86% (12%) |

*Difference is the difference between the reflectance of the oxide-coated film B, C, or D, and the reflectance of Al-coated film A at the same wavelength.

Deposition of both a silica film and an alumina film on the aluminized film A to produce inventive film C leads to a large reduction in reflectance above 10 microns compared to films A and B. As seen in FIG. 2, reflectance of an Al/$SiO_2$/$Al_2O_3$ composite film is 70% or less between 8 microns and 37 microns, 50% or less between 8.25 microns and 32 microns, and 30% or less between 8.5 microns and 27 microns. Further, the reflectance of film C is essentially constant at 16%±3% at wavelengths between 12.5 microns and 26 microns.

As seen in Table 1, deposition of alumina on aluminum (film D) leads to a reduction in reflectance at 10 microns of 28%, relative to the NiChrome/Al coated film A. Deposition of silica on aluminum (film B) leads to a reduction in reflectance at 10 microns of ~3%, relative to film A. When both alumina and silica are used together, a reduction in reflectance of 71% is achieved.

Figure 3:
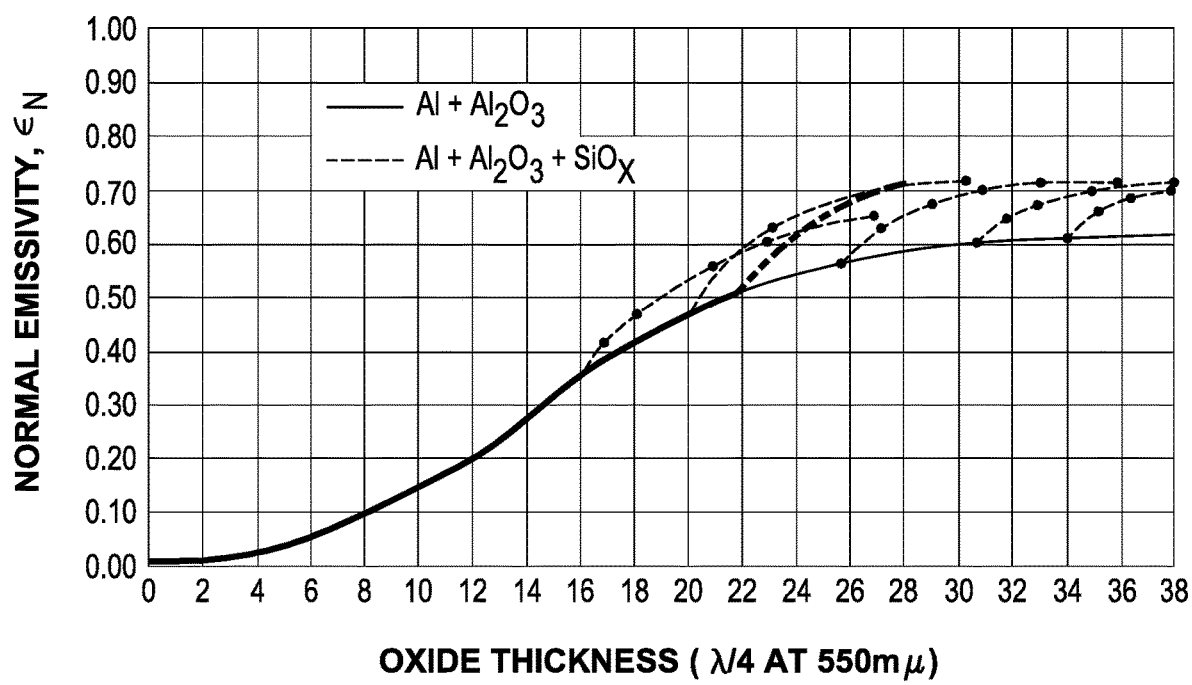
FIG. 3 shows an emissivity as a function of oxide thickness for a polyimide substrate coated with an aluminum thin film and alumina and/or silica.

FIG. 3 shows the impact of oxide thickness, measured in terms of quarter wavelengths at 550 nm, on thermal emissivity in a laminate with an aluminum layer coated with oxide layers. As the thickness of alumina in film D increases, a maximum emittance of about 0.6 is approached at alumina thickness exceeding 30 quarter wavelengths. At an oxide thickness of 22 quarter wavelengths (18,304 angstroms $Al_2O_3$ at 550 nm), the emittance of film D is 0.5. As seen in FIG. 3, deposition of a silica layer having a thickness of between 4λ/4 and 6λ/4 at 550 nm (3,712 angstroms to 5,568 angstroms $SiO_2$ at 550 nm) on an alumina layer with a thickness of 22 to 26 quarter wavelengths (18,304 angstroms to 21,632 angstroms $Al_2O_3$ at 550 nm) increases emissivity to about 0.67 and 0.71.

Figure 4:
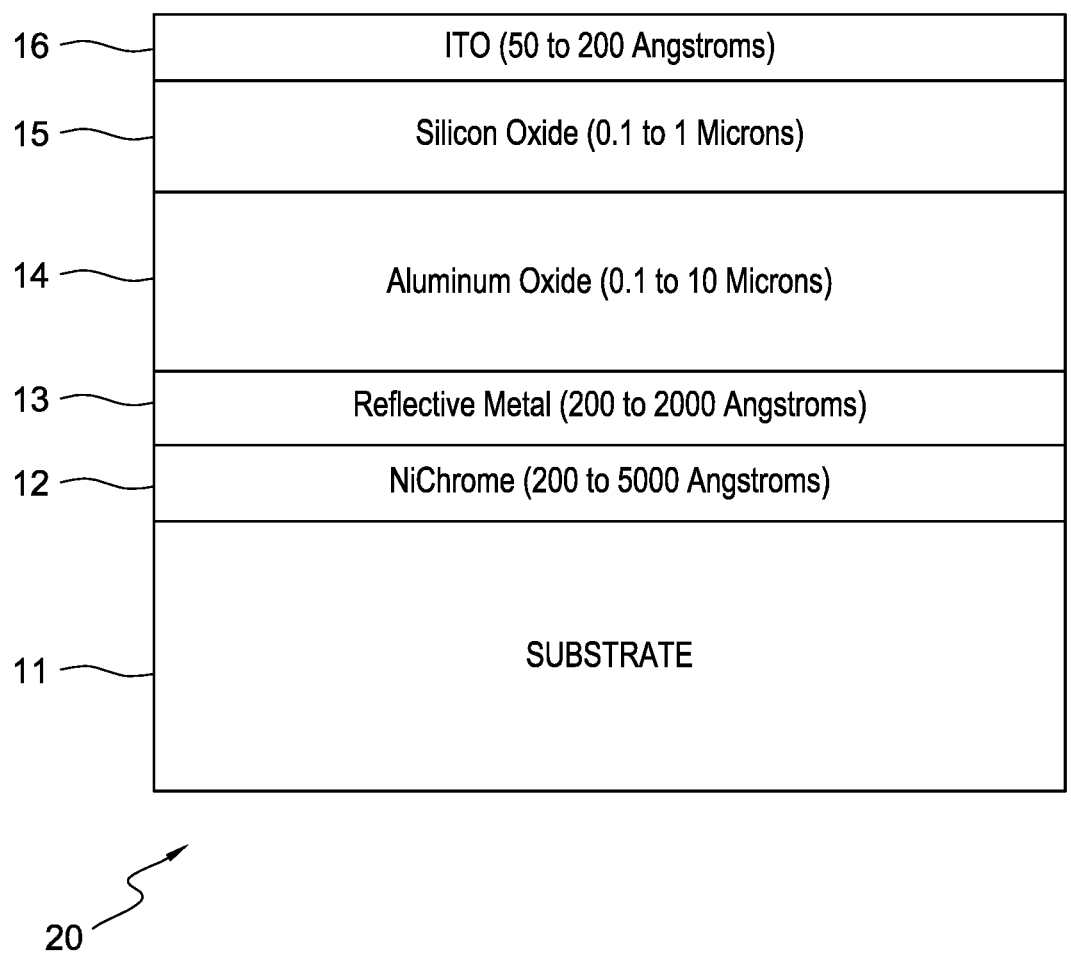
FIG. 4 shows a modified Goddard Composite Coating with a nickel alloy tie layer applied to a substrate.

FIG. 4 shows a laminate 20 with a modified Goddard Composite Coating (GCC) deposited on substrate 11. Again, the substrate may be a rigid metal sheet, a flexible metal foil, or a polymeric film or sheet. The multilayer coating in FIG. 4 includes:

a 500 to 1000 Angstrom film of nickel, nickel-chromium alloy, or nickel-chromium-iron alloy 12;
a 200 to 2000 Angstrom layer of reflective metal 13;
a 0.1 to 10 micron film of aluminum oxide 14;
a 0.1 to 1 micron layer of silicon oxide 15; and
an optional 30 to 250 Angstrom layer of indium tin oxide (ITO) 16.

Suitable metal substrates include rigid sheets formed from aluminum, aluminum alloys, titanium, or titanium alloys. Alternatively, flexible foils of aluminum, titanium, silver, gold, or alloys thereof may serve as a substrate for the modified Goddard Composite Coating. Alternatively, a flexible metal foil or film may be laminated on a polymeric film to form a substrate 11.

Suitable polymeric films or sheets for use as substrate 11 are made of polymeric materials having a melting point above at least 200°. Like the laminate of FIG. 1, the substrate of FIG. 4 may be made from a polyester, such as mono- or biaxially oriented polyethylene terephthalate (PET), e.g., Mylar. The substrate of FIG. 4 may be poly(4,4'-oxydiphenylene-pyromellitimide), a polyimide produced from pyromellitic dianhydride and 4,4'-oxydiphenylamine, also known as Kapton®. The polymeric film or sheet may be filled with a conductive carbon, e.g., graphite or carbon black, if desired. The polymeric film or sheet, when filled with conductive carbon filler, dissipate electrostatic charges on the polymer surface, thereby preventing electrostatic discharge. Also, the conductive carbon filler provides a surface with a roughened texture. In embodiments where the film or substrate is flexible, the substrate may be 0.25 mil to 10 mil thick, 0.5 mil to 5 mil thick, 1 mil to 5 mil thick, 2 mil to 7.5 mil thick, or 2 mil to 5 mil thick.

Other useful substrates include:

woven or nonwoven fiberglass cloth, impregnated with 17% to 22% by weight Teflon (polytetrafluoroethylene or its copolymers);

Polyvinyl fluoride;

Polyvinyl fluoride reinforced with open weave polyaramid, e.g., Kevlar or Nomex, bonded with a polyester adhesive; and Poly(tetrafluoroethylene-co-hexafluoropropylene) with a silver/Inconel composite backing layer.

In embodiments where the substrate is aluminized or otherwise metallized, the substrate may be metallized on one or both surfaces. The modified Goddard Composite Coating may be deposited on a metallized surface, or deposited on a surface opposite a metallized surface.

In various embodiments, the nickel or nickel alloy layer is a nickel/iron/chromium alloy, a nickel/chromium alloy, or nickel. The nickel or nickel alloy layer may be 70% to 100% Ni, 0% to 10% iron, and 0% to 30% Fe. The nickel or nickel alloy layer may be Inconel, comprising:

70% to 99% nickel, 0.5% to 20% chromium, and 0.5% to 10% iron;

72% to 95% nickel, 3% to 19% chromium, and 2% to 9% iron;

75% to 90% nickel, 5% to 18% chromium, and 5% to 7% iron; or

78% to 85% nickel, 10% to 17% chromium, and 5% to 12% iron.

While the Inconel alloy may be substantially free of elements other than Ni, Cr, and Fe, the Inconel alloy may optionally comprise minor amounts of Nb, Ta, Co, Mn, Cu, Al, Ti, Si, C, and/or S.

In various embodiments, the Inconel layer is:

Inconel 600, comprising about 72% nickel, about 14% to 17% chromium, and about 6% to 10% iron;

Inconel X-750, comprising about 72% nickel, about 14% to 17% chromium, and about 5% to 9% iron; or an Inconel alloy comprising about 80% nickel, about 15% chromium; and about 5% iron.

The nickel alloy may be NiChrome, comprising about 70% to about 99.5% nickel and about 0.5% to about 30% chromium; about 72% to about 95% nickel and about 5% to 28% chromium; about 75% to about 90% nickel and about 10% to 25% chromium; about 78% to about 85% nickel and about 15% to 22% chromium; or about 80% nickel and about 20% chromium.

The layer of nickel or a nickel alloy may also be substantially pure nickel. Substantially pure nickel may be >95% Ni, >96% Ni, >97% Ni, >98% Ni, greater than 99% Ni, >99.5% Ni, or >99.9% Ni.

The layer of nickel or a nickel alloy is from 50 angstroms to 1000 angstroms thick, from 75 angstroms to 1500 angstroms thick, from 100 angstroms to 1000 angstroms thick, from 100 angstroms to 500 angstroms thick, from 300 angstroms to 750 angstroms thick, or about 500 angstroms thick.

Figure 5:
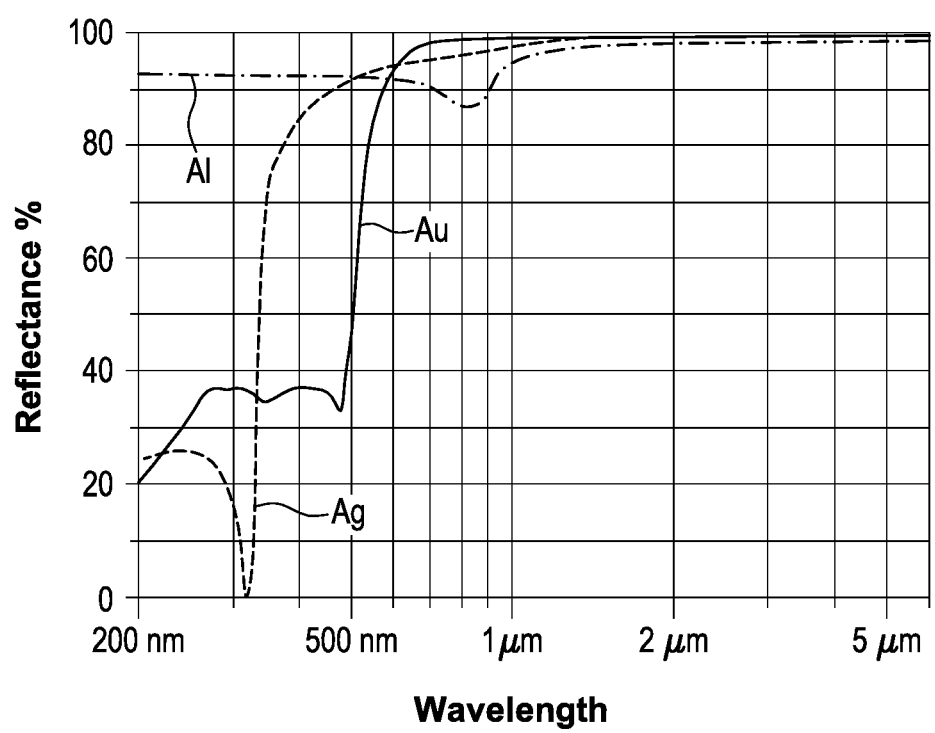
FIG. 5 shows a reflectance of aluminum, silver, and gold films.

In various embodiments, the layer of reflective metal may be gold, silver, or aluminum. The layer of reflective metal may be from 200 angstroms to 2000 angstroms thick, from 400 angstroms to 1800 angstroms thick, from 600 angstroms to 1600 angstroms thick, from 800 angstroms to 1500 angstroms thick, or about 1200 angstroms thick. Gold, silver, and aluminum all offer high reflectivity for wavelengths above about 2 microns, as shown in FIG. 5. Aluminum is cheaper than gold or silver and shows greater than 88% reflectivity from 200 nm to greater than 40 microns, and greater than 95% reflectivity from 1 to 40 microns. Gold, while expensive, shows greater than 95% reflectivity from 600 nm to 40 microns. However, gold shows less than 50% reflectivity below 500 nm. Silver shows greater than 80% reflectivity from 390 nm to 40 microns, and less than 50% reflectivity below 350 nm. Above 600 nm, gold and silver are consistently more reflective than aluminum.

Based on the above, if low cost or maximum reflection of visible light, e.g., below 700 nm, are major concerns, aluminum may be the best choice for a reflective layer. If cost is not a concern and one is more concerned with maximizing reflectivity of infrared light than visible light, either silver or gold are better choices than aluminum for a reflective layer. In various embodiments of the GCC multilayer film disclosed herein, high reflectance from 250 nm to 2.5 microns, or from 390 nm to 2.5 microns, is desired. In such embodiments, either aluminum or silver is preferable to gold.

In various embodiments, the layer of aluminum oxide and the layer of silicon oxide are collectively from 10,000 to 50,000 angstroms thick; from 12,000 to 35,000 angstroms thick; or from 14,000 to 28,000 angstroms thick. The ratio of the thickness of the silicon oxide layer to the thickness of the aluminum oxide layer may be from 0.1:1 to 0.25:1, from 0.15:1 to 0.22:1, or about 0.18:1.

Alternatively, the layer of aluminum oxide may be from 0.1 to 10 microns thick, from 0.5 to 5 microns thick, from 0.8 to 3 microns thick, or 1 to 2 microns thick. The layer of silicon oxide may be from 0.1 to 1 micron thick, from 0.25 to 0.9 microns thick, from 0.35 to 0.8 microns thick, or 0.4 to 0.7 microns thick.

If an indium tin oxide (ITO) layer is present, the ITO layer may be from 30 angstroms to 250 angstroms thick, from 50 angstroms to 200 angstroms thick, from 60 angstroms to 150 angstroms thick, from 60 angstroms to 120 angstroms thick, from 80 angstroms to 110 angstroms thick, or about 100 angstroms thick. ITO is a transparent conducting oxide. Increasing the thickness of the ITO film increases the conductivity of ITO, but decreases its transparency.

ITO surface films are useful where buildup of charge on the GCC film surface is a concern. A spacecraft or satellite surface may undergo electrostatic charge buildup, due to exposure to plasma, electric or magnetic fields, and solar radiation. If sensitive electronics or electrical equipment are near the GCC film, discharge of an electrostatic charge on the film surface may cause damage to the electronics or equipment. In such cases, a conductive ITO film helps prevent electrostatic discharge by dissipating charge on the GCC film surface. If no electronics or electrical equipment are near the GCC film, an ITO film may be unnecessary. Further, the ITO layer slightly increases solar absorbance and reduces reflectance between 250 nm and 2.5 microns. If electrostatic discharge is not a concern, the ITO layer may be omitted to optimize reflectivity in this range.

Judicious selection of substrate materials and/or component materials for the composite coating allows one to tune certain properties of a polyimide/GCC laminate to a desired value. For example, used of a conductive, carbon filled polyimide film reduces solar reflectance without increasing emittance. Use of a resistive polyimide film increases solar reflectance without changing emittance. Use of a conductive, carbon filled polyimide film also causes diffuse reflection of light, while a resistive polyimide film leads to specular reflection of light. IR emittance may be changed by altering the oxide thickness in the GCC coating.

In a conductive polyimide substrate, conductive carbon particles provide the substrate with a textured surface and high conductance. If a resistive polyimide substrate is desired in conjunction with a GCC film having high solar absorbance or diffuse reflectance, a substrate film with little or no conductive carbon may be textured with surface features having a peak-to-valley height of between 100 nm and 10 microns. Polyimide films may be textured by coating wife a thin copper film and heated in air, or by RF sputter etching in $O_2/CF_4$ mixtures. A GCC film deposited on the textured substrate will exhibit higher solar absorbance and more diffuse reflectance than a comparable resistive polyimide substrate with a smooth, non-textured surface.

By adjusting solar absorbance and/or IR emittance, independently or together, optical properties of the polyimide/GCC laminate may be tuned to achieve desired values, as shown in the following examples. Further, solar absorbance may be adjusted by altering the surface texture of the substrate. In the examples below, solar absorbance is adjusted by altering the conductivity of the polymeric substrate surface by incorporating a conductive filler. A high resistance correlates with a low level of filler, and a high solar absorbance. Alternatively, solar absorbance may be adjusted without changing conductance by texturing a metal foil, fetal sheet or polymeric substrate by etching or a similar technique. A textured substrate has greater absorbance than a smooth substrate.

Example 1. Surface Emittance of Polyimide Films with GCC Multilayer Coatings A conductive black Kapton® polyimide film was sequentially coated with a 500 angstrom layer of NiChrome alloy; a 1200 angstrom layer of silver; an ~15,000 angstrom layer of aluminum oxide; and a ~4,000 angstrom layer of silicon oxide. The polyimide film was 24 inches wide, and was fixed to the outer surface of a rotating drum. The various layers were evaporated from target materials in a graphite crucible using an electron beam, and deposited onto the polyimide film at a rate of between 2 and 4 angstroms per second. A central band of the film on the rotating drum was closer to the crucible than the edges of the film; a deposition baffle was used to partially protect this central band from excessive deposition and ensure an even film thickness across the width of the film. A second black polyimide film was coated in the same manner as the first film, and served as a control film.

Figure 6A:
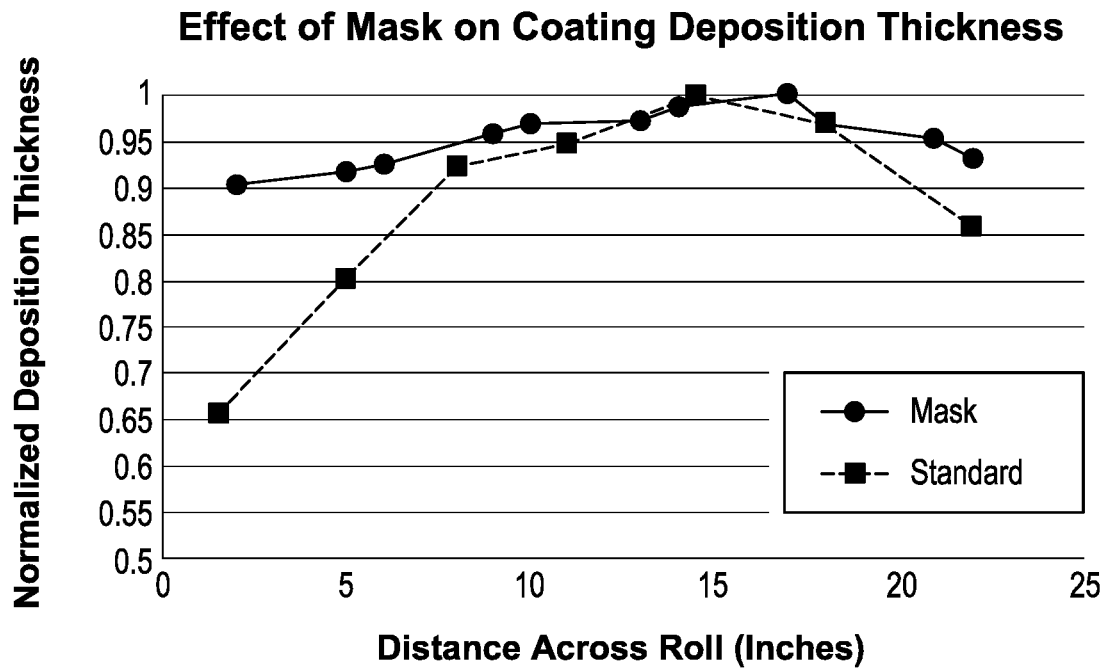
FIG. 6A shows the effect of a mask or deposition baffle on oxide film thickness in the modified Goddard Composite Coating.

The thicknesses of the deposited oxide layers (alumina plus silica) were recorded as a function of distance across the film. In the inventive film deposited at a rate of between 2 and 4 angstroms per second using a deposition baffle, the oxide layers had a roughly uniform thickness. At one edge, the thickness of the composite alumina/silica oxide layer was 90% of the observed maximum thickness, and at the other edge, the thickness of the composite oxide layer was 93% of the observed maximum thickness, as shown in FIG. 6A. In the control film deposited without a deposition baffle, the oxide layers had a highly non-uniform thickness, with one edge having a thickness about 65% of that obtained in the middle of the film. The other edge of the control film had a thickness about 80% of the maximum oxide film thickness.

Figure 6B:
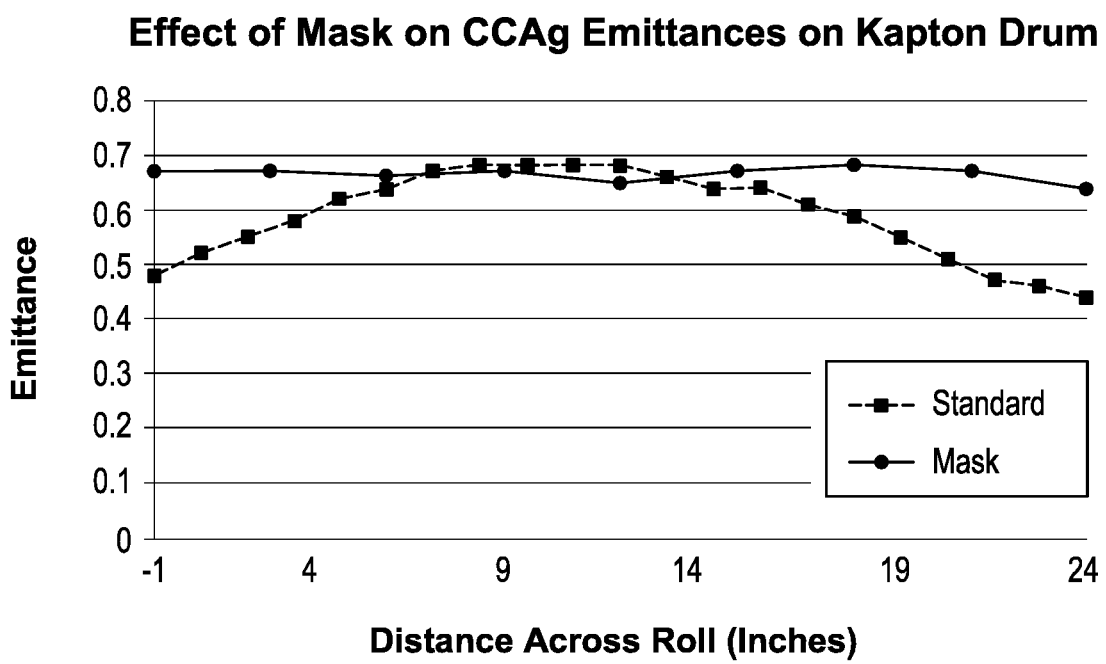
FIG. 6B shows the effect of a mask or deposition baffle on emittance in the modified Goddard Composite Coating, across the width of the film.

Film emittance was next recorded as a function of distance across the width of the film. The inventive film had a substantially constant emittance of between 0.64 and 0.68 over the film width. In contrast, the control film had a high emittance (about 0.68) at the film center, and a low emittance (<0.55) at the film edges, where the oxide thickness was low. Thus, slow oxide deposition with a deposition baffle results in oxide layers having a more uniform thickness and IR emittance, as shown in FIG. 6B.

Example 2. Absorbance of Polyimide Films with GCC Multilayer Coatings

A series of black Kapton® polyimide films was obtained, as shown in Table 2 below. Two types of polyimide films were used in this example. Several films, including Kapton® 275XC, 160XC, 100XC, 200DR FC, 200DR BC, and 350DR FC, are single layer polyimide films. These films are conductive films loaded with conductive carbon. The films have black matte surfaces, and are durable from −270° C. to 270° C. Films 2 through 4 in Table 2 below are single layer polyimide films, and have front and back surfaces with similar resistivities.

Kapton®200RS100 in Table 2 below is a two layer polyimide film. On one side is a dielectric conductive film loaded with conductive carbon, while the other side is a dielectric polyimide film. The conductive surface of the film has a black matte surface, while the dielectric surface is smooth and shiny. The two layer polyimide film is durable from −270° C. to 270° C. The Kapton® XC1000, XC600, XC3500, XC450, XC300, and 350DR BC films also have a front surface with lower resistance than their back surface. The front surface has a high concentration of conductive carbon in these films, while the more resistive dielectric surface either has a low concentration of conductive carbon, or is formed from a sheet of polyimide film which is free of conductive carbon.

The polyimide films in Table 2 were sequentially coated with 500 angstrom layer of NiChrome alloy; a 1200 angstrom layer of silver; an ~15,000 angstrom layer of aluminum oxide; an ~4,000 angstrom layer of silicon oxide; and a 100 angstrom layer of indium tin oxide. One sample of each film was coated with the multilayer Goddard Composite Coating on the front surface, and the other was coated on the back surface. Solar absorbance was measured between 250 nm and 2.5 microns for each front coated film and for each back coated film. Measured resistivity of uncoated Kapton film surfaces and solar absorbance of coated film surfaces are recorded in Table 2. Absorbance of the coated film surfaces and resistance of the polyimide film substrate surfaces has been plotted in FIG. 7.

Figure 7:
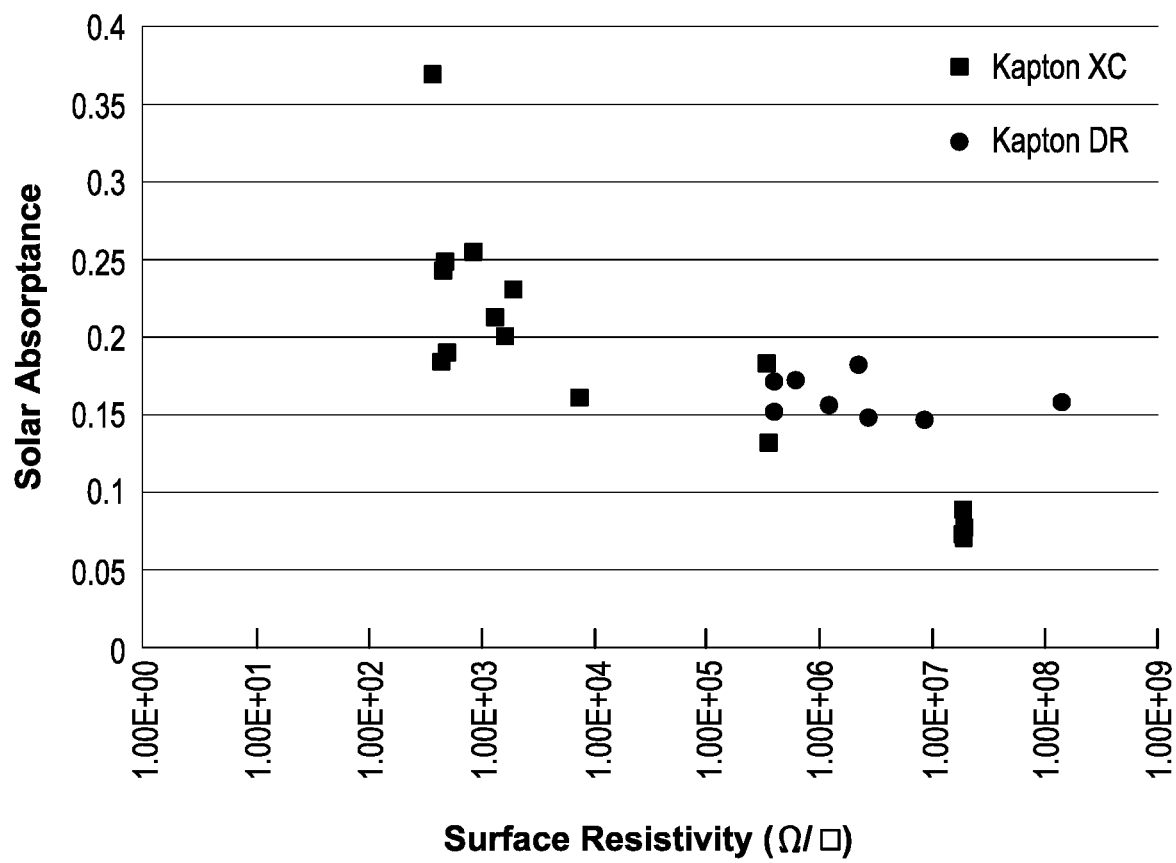
FIG. 7 shows absorbance in modified Goddard Composite Coatings deposited on a variety of polyimide substrates.

As shown in FIG. 7 and Table 2, if a low resistance, e.g., about $4 \times 10^2$ to $8 \times 10^{3'} \Omega/\square$, polyimide surface is used for deposition, a solar absorbance of 0.16 to 0.37 is obtained, although results typically cluster between 0.18 and 0.26. If a higher resistance surface, with a resistance of about $2 \times 10^5$ to $1 \times 10^7 \Omega/\square$, polyimide surface is used for deposition, a solar absorbance of 0.13 to 0.18 is obtained. If a polyimide surface with a resistance exceeding $1 \times 10^{7'} \Omega/\square$ is used for deposition, a solar absorbance of 0.07 to 0.09 may be obtained, as seen in FIG. 7.

TABLE 2

| Kapton ® Substrate | Solar Absorbance[1] (front) | Solar Absorbance[1] (back) | Resistivity, 'Ω/ □ (front) | Resistivity, 'Ω/ □ (back) | Thickness (mils) |
|---|---|---|---|---|---|
| 200RS100 | 0.369 | 0.089 | $3.71 \times 10^2$ | $1.88 \times 10^7$ | 2.2 |
| 275XC | 0.19 | 0.243 | $4.92 \times 10^2$ | $4.61 \times 10^2$ | 2.6 |
| 160XC | 0.184 | 0.248 | $4.43 \times 10^2$ | $4.73 \times 10^2$ | 1.7 |
| 100XC | 0.132 | 0.183 | $3.51 \times 10^5$ | $3.42 \times 10^5$ | 1.1 |
| XC1000 | 0.231 | 0.071 | $1.92 \times 10^3$ | $1.87 \times 10^7$ | 1.7 |
| XC600 | 0.201 | 0.072 | $1.62 \times 10^3$ | $1.90 \times 10^7$ | 3.2 |

TABLE 2-continued

| Kapton® Substrate | Solar Absorbance[1] (front) | Solar Absorbance[1] (back) | Resistivity, 'Ω/☐ (front) | Resistivity, 'Ω/☐ (back) | Thickness (mils) |
|---|---|---|---|---|---|
| XC3500 | 0.161 | 0.073 | 7.42 × 10³ | 1.84 × 10⁷ | 3.3 |
| XC450 | 0.213 | 0.071 | 1.83 × 10³ | 1.87 × 10⁷ | 3.3 |
| XC300 | 0.255 | 0.077 | 8.44 × 10² | 1.91 × 10⁷ | 2.7 |
| 200DR FC | 0.148 | 0.147 | 2.70 × 10⁶ | 8.50 × 10⁶ | — |
| 200DR BC | 0.172 | 0.172 | 6.20 × 10⁵ | 4.00 × 10⁵ | — |
| 350DR FC | 0.156 | 0.172 | 1.20 × 10⁶ | 2.20 × 10⁶ | — |
| 350DR BC | 0.152 | 0.158[2] | 4.00 × 10⁵ | 1.40 × 10⁸ | — |

1. Measured 5 inches from the edge of the GCC Film.
2. This absorbance value, as seen in FIG. 7, is anomalously high for a Kapton® surface with a resistivity exceeding 1 × 10⁷ 'Ω/☐.

Thus, by properly selecting the electrical resistance of the substrate, solar absorbance of a polyimide surface coated with the Goddard Composite Coating may be adjusted. This is believed to be due to the surface roughness of the substrate. A conductive polyimide surface is black due to the presence of conductive carbon, and has a roughened texture from carbon particles. The black surface has a greater tendency to absorb light, and has a less reflective matte surface. A resistive polyimide surface has less conductive carbon, and a lower tendency to absorb light. The resistive polyimide surface is also a smoother, more reflective surface than a conductive matte surface. Thus, by controlling surface roughness, which correlates inversely with resistance in Table 2, solar absorbance can be modified or tuned over a wide range.

Figure 8:
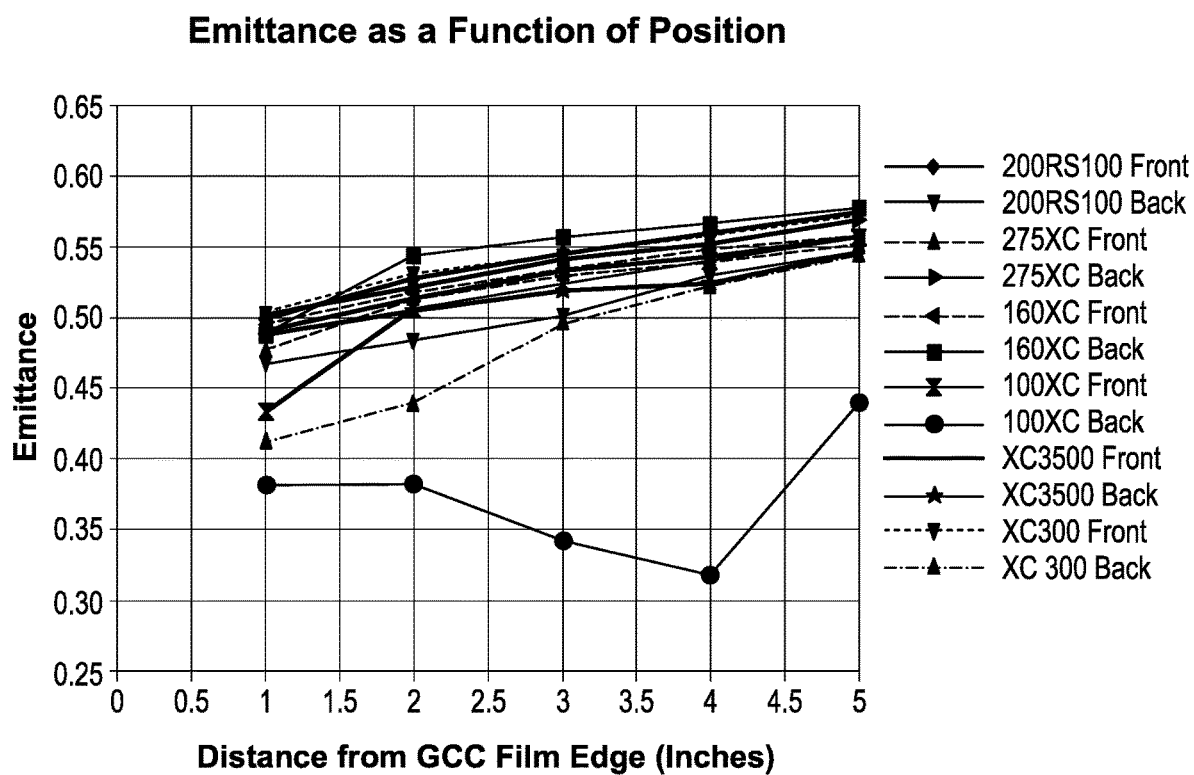
FIG. 8 shows emittance in modified Goddard Composite Coatings deposited on a variety of polyimide substrates, across the width of the film.

Example 3. Solar Absorbance/IR Emittance Ratio of Polyimide Films with GCC Multilayer Coatings The IR emittance of the films of Table 2 was tested as a function of distance across the film, and the results for Goddard Composite coatings on both the front and back surfaces of Kapton® 200R5100, 275XC, 160XC, 100XC, XC3500, and XC300 films. As seen in FIG. 8, IR emittance one inch from the edge of the film generally ranges from 0.4 to 0.5, while IR emittance 5 inches from the edge of the film ranges from 0.54 to 0.58. Emittance from a Kapton® 100XC film with a GCC multilayer film on the rear surface falls outside these ranges; however, the large dip in emittance 4 inches from the film edge suggests that the Kapton® 100XC film rear surface may have an uneven oxide coating. As shown in FIGS. 6A and 6B, an uneven oxide coating thickness can lead to changes in emittance.

Table 3 reports values for solar absorbance and IR emittance of GCC-coated polyimide films, as well as resistance of polyimide film substrate surfaces. Setting aside Kapton® 100XC film coated on the rear surface, it is seen that all GCC-coated polyimide films have similar IR emittance of 0.54 to 0.58. GCC-coated conductive polyimide films with a substrate resistance of under 2×10³ have a ratio of solar absorbance to IR emittance ($\alpha/\varepsilon_N$) of greater than 0.33. GCC-coated polyimide films with a substrate resistance of greater than 1×10⁷ have a ratio of solar absorbance to IR emittance ($\alpha/\varepsilon_N$) of less than 0.16. Kapton® 100XC film, with a GCC multilayer coating on its front surface, has a resistance of about 3.5×10⁵, and has a ratio of solar absorbance to IR emittance ($\alpha/\varepsilon_N$) of 0.24.

Thus, the ratio of solar absorbance to IR emittance can be tailored by changing the absorbance of the substrate, without notably changing IR emittance. In the case of polyimide films, absorbance may be changed by changing the concentration of conductive carbon in the substrate, as discussed in Example 2. To minimize $\alpha/\varepsilon_N$, a polyimide substrate with resistance of greater than 1×10⁵ may be used.

TABLE 3

| Kapton® Substrate | Solar Absorbance[1] | Emittance[1] | $\alpha/\varepsilon_N$ | Resistivity[2] |
|---|---|---|---|---|
| 200RS100 (front) | 0.369 | 0.58 | 0.64 | 3.71 × 10² |
| 200RS100 (back) | 0.089 | 0.55 | 0.16 | 1.88 × 10⁷ |
| 275XC (front) | 0.19 | 0.55 | 0.35 | 4.92 × 10² |
| 275XC (back) | 0.243 | 0.57 | 0.43 | 4.61 × 10² |
| 160XC (front) | 0.184 | 0.56 | 0.33 | 4.43 × 10² |
| 160XC (back) | 0.248 | 0.58 | 0.43 | 4.73 × 10² |
| 100XC (front) | 0.132 | 0.55 | 0.24 | 3.51 × 10⁵ |
| 100XC (back) | 0.183 | 0.44 | 0.42 | 3.42 × 10⁵ |
| XC600 (front)[3] | 0.201 | 0.56 | 0.36 | 1.62 × 10³ |
| XC600 (back)[3] | 0.072 | 0.54 | 0.13 | 1.90 × 10⁷ |
| XC3500 (front) | 0.161 | 0.56 | 0.29 | 7.42 × 10³ |
| XC3500 (back) | 0.073 | 0.55 | 0.13 | 1.84 × 10⁷ |
| XC300 (front) | 0.255 | 0.57 | 0.45 | 8.44 × 10² |
| XC300 (back) | 0.077 | 0.55 | 0.14 | 1.91 × 10⁷ |

1. Measured 5 inches from the edge of the GCC Film.
2. This resistivity value corresponds to Kapton® film resistance prior to deposition of a GCC coating.
3. Not included in FIG. 8.

Alternatively, the ratio of solar absorbance to IR emittance can be tailored by changing the thickness of the oxide layer as shown in previously discussed FIG. 3. This changes IR emittance, without changing solar absorbance.

Example 4. Reflectance of Polyimide Films with GCC Multilayer Coatings

Figure 9:
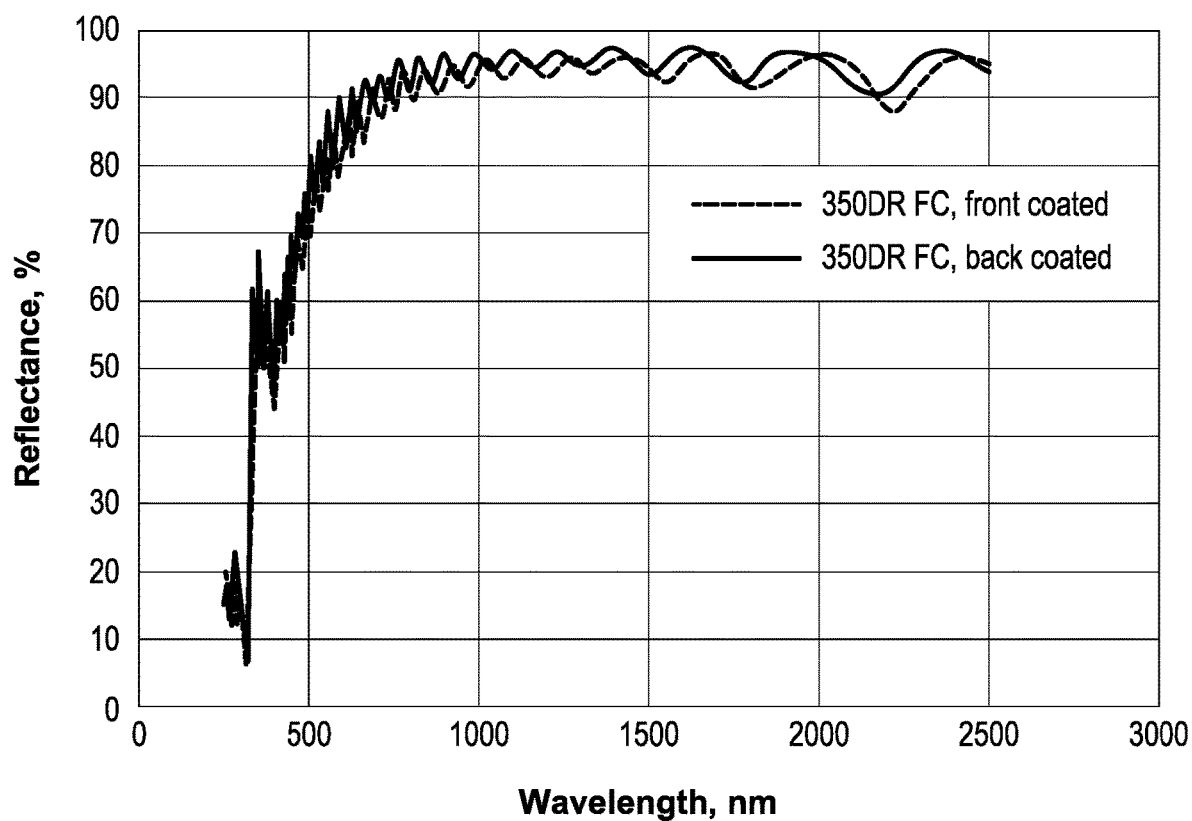
FIG. 9 shows solar absorbance as a function of wavelength for two GCC-coated polyimide films, from 250 nm to 2500 nm (2.5 microns)

The solar reflectivity of front- and back-coated Kapton® 350DR FC films of Table 2 was recorded over a range of 250 nm to 2.5 microns. Above 750 nm, both GCC-coated films had >90% solar reflectivity. However, at about 500 nm, solar reflectivity was 70%. At shorter wavelengths, reflectivity dropped rapidly, as seen in FIG. 9.

This result is not unexpected, as silver has poor reflectivity below 350 to 400 nm as shown in FIG. 5. If high reflectance at short wavelengths is required, the Goddard Composite Coating may be prepared with an aluminum reflective layer instead of a silver layer. As seen in FIG. 5, aluminum has >90% reflectivity below 500 nm. However, use of aluminum is likely to slightly increase absorbance above 500 nm, as aluminum is less reflective than silver in this range. Alternatively, if high reflectivity above 500 nm and low reflectivity below 500 nm is desired, the Goddard Composite Coating may be prepared with a gold reflective layer. As seen in FIG. 5, gold has poor reflectivity below 500 nm, and may be partially used to absorb blue, violet, and UV light. Thus, by altering the reflective metal in the Goddard Composite Coating, reflectivity of sort wavelength solar radiation may be adjusted.

Example 5. Specular Vs. Diffuse Reflectance of Polyimide Films with GCC Multilayer Coatings The reflectance of solar and IR radiation at several wavelengths was tested for several polyimide films of Table 2, and the angular dependence of the reflection was recorded. As seen in Table 4, two films were exposed to light beams which would provide ideal specular reflection angles of 40°, and two to light beams which would provide specular reflection angles of 10°. The results are reported in Table 4, and FIGS. 10A to 10D

TABLE 4

| Film | Resistivity | Angle of Reflection | Max. Reflection, 400 nm | Max. Reflection, 700 nm | Max. Reflection, 1500 nm | Max. Reflection, 2000 nm |
|---|---|---|---|---|---|---|
| Kapton® 200DR | $2.7 \times 10^6$ | 40° | 12 | 33 | 56 | 74 |
| Kapton® 275XC, back coated | $4.61 \times 10^2$ | 40° | 0.5 | 1.2 | 5.4 | 12 |
| Kapton® 100XC, front coated | $3.5 \times 10^5$ | 10° | — | 10 | 26 | 33 |
| Kapton® 160XC, front coated | $4.43 \times 10^2$ | 10° | — | 2.5 | 2.5 | 2 |

Figure 10A:
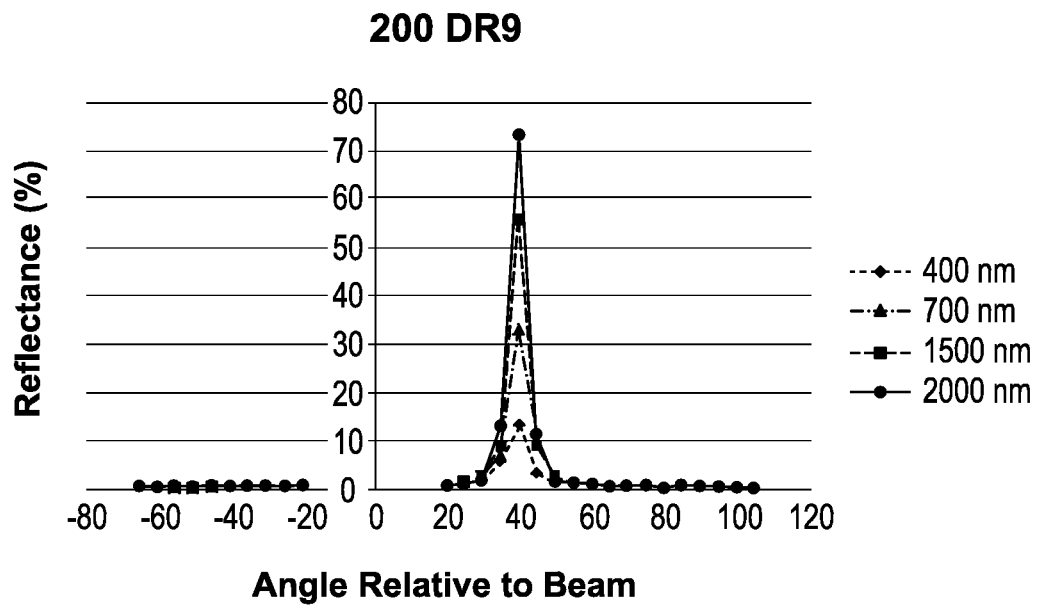
FIGS. 10A and 10C show roughly specular IR reflectance for two GCC-coated polyimide films having high resistance.
Figure 10B:
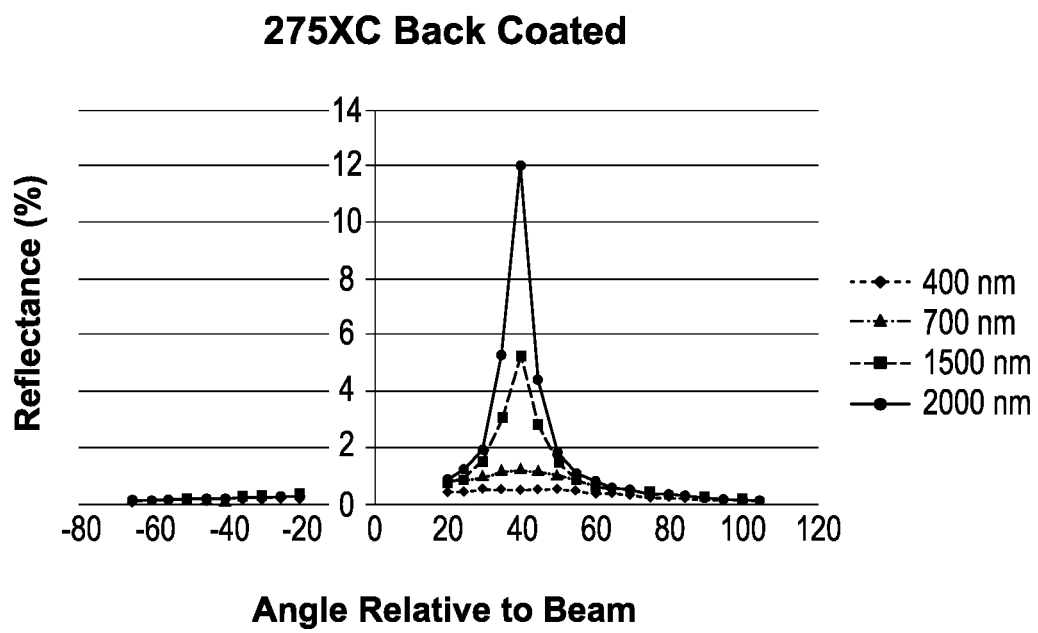
FIGS. 10B and 10D show diffuse IR reflectance for two GCC-coated polyimide films having comparatively low resistance.

As can be seen in Table 4 above, and by a comparison of FIG. 10A and FIG. 10B, the resistive Kapton® 200DR film, with a low concentration of conductive carbon, has high peak reflectance of IR radiation, e.g., 1500 nm to 2000 nm, at a reflection angle of 40°. The conductive Kapton® 275XC has a rough surface due to conductive carbon, with a peak IR reflectance of 12% at 2000 nm and 5.4% at 1500 nm. Due to absorbance of visible light, reflectance of visible light below 700 nm is suppressed.

Figure 10C:
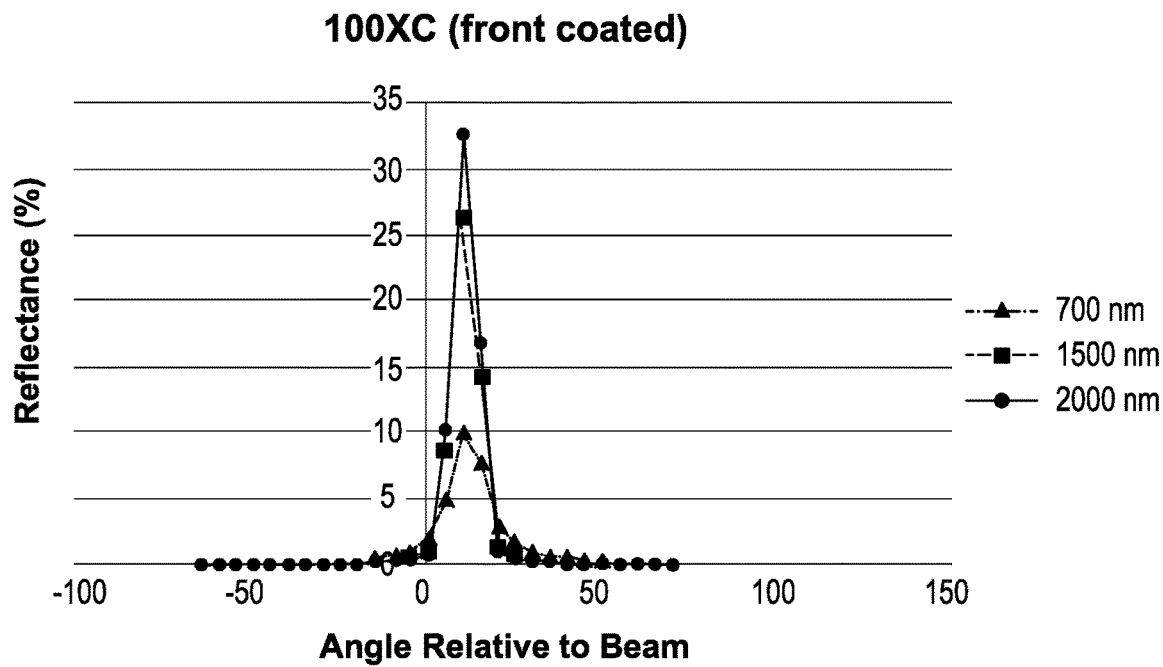
Figure 10D:
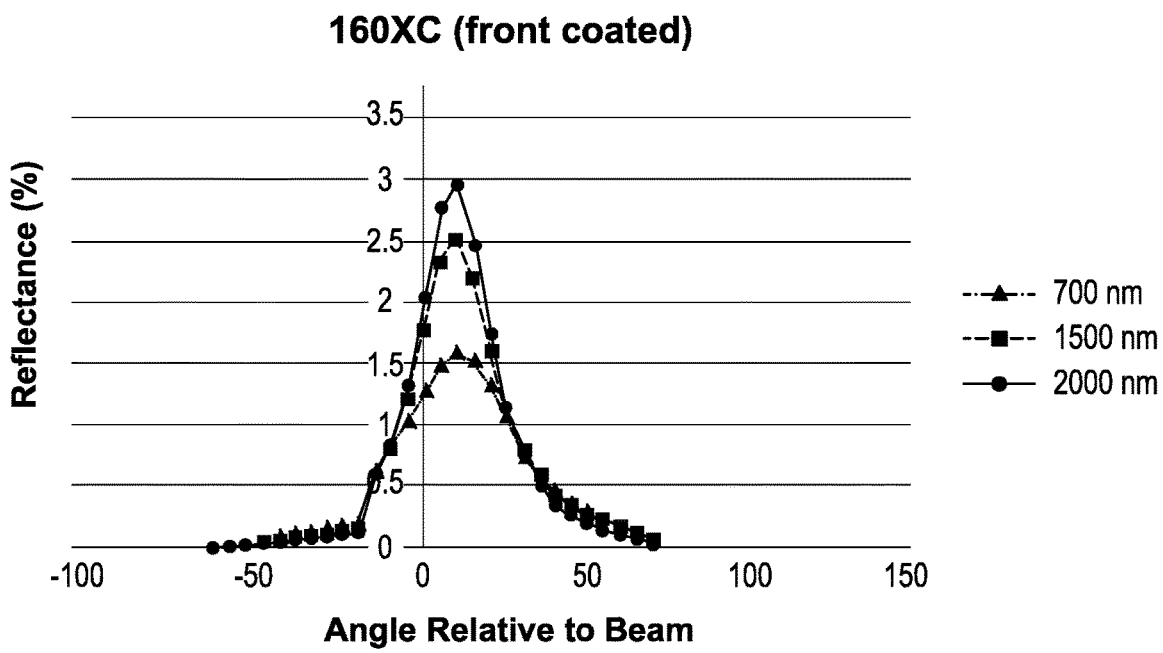

Also, as by a comparison of FIG. 10C and FIG. 10D, the resistive Kapton® 100XC film has high peak reflectance of IR radiation at a reflection angle of 10°. Kapton® 100XC has a peak IR reflectance of 33% at 2000 nm and 26% at 1500 nm. Conductive Kapton® 160XC has a peak IR reflectance of 3% at 2000 nm; reflection peaks are broadened and poorly defined.

The low IR reflection in the conductive Kapton® 160XC and Kapton® 275XC films is due to a roughened film surface caused by the conductive carbon filler. The roughened surface scatters light, leading to diffuse reflectance. In contrast, the resistive films have a smoother surface with little or no conductive carbon, leading to specular reflectance.

Accordingly, it is to be understood that the above description is intended to be illustrative and not restrictive. Many embodiments and applications other than the examples provided would be apparent upon reading the above description. The scope should be determined, not with reference to the above description or Abstract below, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

All terms used in the claims are intended to be given their broadest reasonable constructions and their ordinary meanings as understood by those knowledgeable in the technologies described herein unless an explicit indication to the contrary in made herein. In particular, use of the singular articles such as "a," "the," "said," etc. should be read to recite one or more of the indicated elements unless a claim recites an explicit limitation to the contrary.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A laminate, comprising:
a polymeric substrate, said substrate having a surface resistivity of $4 \times 10^2$ to $1 \times 10^8 \Omega/\square$;
a 200 to 5000 angstrom thick layer of a nickel-chromium alloy;
a 200 to 2000 angstrom thick layer of a reflective metal;
a 0.1 to 10 micron thick layer of aluminum oxide; and
a 0.1 to 1 micron thick layer of silicon oxide;
wherein the laminate has solar absorbance at a wavelength of 0.25 microns to 2.5 microns of between 0.07 and 0.7; and the laminate has an IR emittance of 0.1 to 0.8.

2. The laminate of claim 1, wherein the laminate further comprises a 50 to 200 angstrom thick layer of indium tin oxide on the layer of silicon oxide.

3. The laminate of claim 1, wherein the substrate has a conductive filler and a surface resistivity of $4 \times 10^2$ to $8 \times 10^3 \Omega/\square$, and the laminate has a solar absorbance of 0.16 to 0.37.

4. The laminate of claim 1, wherein the substrate has a conductive filler and a surface resistivity of $2 \times 10^5$ to $1 \times 10^7 \Omega/\square$, and the laminate has a solar absorbance of 0.13 to 0.18.

5. The laminate of claim 1, wherein the substrate has a surface resistivity of $1 \times 10^7$ to $1 \times 10^8 \Omega/\square$, and the laminate has a solar absorbance of 0.07 to 0.09.

6. The laminate of claim 1, wherein the laminate has an IR emittance of 0.44 to 0.6.

7. The laminate of claim 1, wherein the reflective metal is silver, gold, or aluminum.

8. The laminate of claim 1, wherein the reflective metal is silver.

9. The laminate of claim 1, wherein the laminate has a reflectance of less than 40% for light having a wavelength of 7 to 30 microns.

10. The laminate of claim 9, wherein the laminate has a reflectance of less than 30% for light having a wavelength of 10 to 25 microns.

11. The laminate of claim 9, wherein the laminate has:
    a reflectance of less than 40% for light having a wavelength of 7 to 30 microns, and
    a reflectance of greater than 80% for light having a wavelength of 2.5 nm to 2.5 microns.

12. The laminate of claim 11, wherein the laminate exhibits specular reflectance of light having a wavelength of 2.5 nm to 2.5 microns.

13. The laminate of claim 11, wherein the laminate exhibits diffuse reflectance of light having a wavelength of 2.5 nm to 2.5 microns.

14. The laminate of claim 1, wherein the substrate is a polymeric film having a melting point of at least 200° C.

15. The laminate of claim 14, wherein the polymeric film is a biaxially oriented polyester film or a polyimide film.

16. The laminate of claim 1, wherein the substrate has a smooth surface.

17. The laminate of claim 1, wherein the substrate has a roughened surface.

18. The laminate of claim 1, wherein the substrate has a roughened surface with features having a height of between 100 nm and 10 microns.

19. A laminate, comprising:
    a polymeric substrate, said substrate having a textured surface with features having a peak-to-valley height of 100 nm to 10 microns;
    a 200 to 5000 angstrom thick layer of a nickel-chromium alloy;
    a 200 to 2000 angstrom thick layer of a reflective metal;
    a 0.1 to 10 micron thick layer of aluminum oxide; and
    a 0.1 to 1 micron thick layer of silicon oxide;
wherein the laminate has:
    a solar absorbance at a wavelength of 0.25 microns to 2.5 microns of between 0.07 and 0.7;
    diffuse reflectance of radiation having a wavelength of between 250 nm and 2.5 microns; and
    an IR emittance of 0.1 to 0.8.

20. The laminate of claim 19, wherein the laminate further comprises a 50 to 200 angstrom thick layer of indium tin oxide on the layer of silicon oxide.

* * * * *